(12) United States Patent
Pille et al.

(10) Patent No.: US 7,295,481 B2
(45) Date of Patent: Nov. 13, 2007

(54) POWER SAVING BY DISABLING CYCLIC BITLINE PRECHARGE

(75) Inventors: Juergen Pille, Stuttgart (DE); Rolf Sautter, Bondorf (DE); Christian Schweizer, Stuttgart (DE); Klaus Thumm, Pfalzgrafenweiler (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/711,982

(22) Filed: Oct. 18, 2004

(65) Prior Publication Data
US 2005/0117421 A1    Jun. 2, 2005

(30) Foreign Application Priority Data
Oct. 16, 2003 (EP) .................. 03103837

(51) Int. Cl.
*G11C 7/00* (2006.01)

(52) U.S. Cl. .................. 365/203; 365/207; 365/189.04

(58) Field of Classification Search .......... 365/203.02, 365/189.04, 195, 203, 230.03, 207
See application file for complete search history.

(56) References Cited

U.S. PATENT DOCUMENTS

| 4,318,014 | A |   | 3/1982 | McAlister et al. .......... 326/106 |
| 4,926,384 | A | * | 5/1990 | Roy ....................... 365/230.03 |
| 5,357,474 | A |   | 10/1994 | Matano et al. .............. 365/203 |
| 5,672,987 | A | * | 9/1997 | Tanaka et al. ................ 327/91 |
| 5,745,427 | A | * | 4/1998 | Freyman et al. ....... 365/230.01 |
| 5,828,610 | A |   | 10/1998 | Rogers et al. .............. 365/203 |
| 5,950,223 | A | * | 9/1999 | Chiang et al. ......... 365/230.03 |
| 6,141,272 | A | * | 10/2000 | Van de Graaff et al. .... 365/201 |
| 6,236,585 | B1 |   | 5/2001 | Hill ............................ 365/49 |
| 6,373,779 | B1 | * | 4/2002 | Pang et al. ............ 365/230.05 |
| 6,404,689 | B1 | * | 6/2002 | Kirihata et al. ............. 365/222 |
| 6,768,659 | B2 |   | 7/2004 | Gillingham et al. .......... 365/49 |
| 2005/0047239 | A1 | * | 3/2005 | Takahashi et al. .......... 365/222 |
| 2005/0125596 | A1 | * | 6/2005 | Yap ............................. 711/105 |

* cited by examiner

*Primary Examiner*—Thong Q. Le
(74) *Attorney, Agent, or Firm*—Michael J. Le Strange

(57) ABSTRACT

A method and system of accessing memory cells within a dynamic hardware memory block operated with a bitline precharge circuit, in which differential read/write access operations are performed by activating complementary bitlines. A reduction in power dissipation is realized by determining whether a next access operation following a current access operation is a read or write access, and performing a precharge of the bitlines of the array only when a read operation follows the current access operation. A conventional precharge control signal is combined with an external control signal indicating if the next cycle is a read cycle. The combination of the two signals can be used, for example, as input to a simple AND gate to generate an effective precharge signal. The effective precharge signal permits precharging of bitlines only when those bitlines are used for read access in a respective next cycle.

5 Claims, 3 Drawing Sheets

POWER SAVING BY DISABLING CYCLIC BITLINE PRECHARGE

FIELD OF THE INVENTION

The present invention relates to computer hardware and in particular to power management of high frequency storage designs which are able to implement differential write or read access in a dynamic hardware arrangement of storage cells having some inner segmentation. More particularly, the present invention relates to a method and respective system of accessing memory cells within a dynamic hardware memory block operated with a precharge mechanism, in which differential read/write accesses are performed by activating true and complement bit lines.

BACKGROUND OF THE INVENTION

In general, a strong need exists to reduce power dissipation in computer systems. This requirement is particularly significant in respect to handheld devices and notebook computers for applications or situations in which the device is not connected to an external supply voltage. Several prior art methods realize power savings by switching off or idling discrete sub-systems of a microprocessor or other integrated circuit device when such sub-systems are inactive for a given period of time, e.g. pressing a key or moving a mouse pointer, etc. Another technique to reduce power dissipation in computer systems is based on tailoring the operation of the device to reduce unnecessary operations that contribute to power dissipation.

In modern storage array designs several storage cells are connected to one write-head and one read-head in the form of a sense amplifier via pairs of bitlines (BL), whereby each pair of bitlines consists of one "true" and one "complement" bitline. For fast access time and low power consumption the bitlines are precharged, according to prior art technology, each cycle to read data from and write data to the cells. A separate signal input controls whether data is written or read. In a differential write and read access memory scheme with true and complement bitlines, one bitline must be drawn to high and the other must be drawn to zero independently of the bit value to be written. The precharge may be accomplished with respect to a single memory cell, or an entire segment comprising a sub-array of memory cells.

With specific reference to the aspect of power saving during operation it should be noted that prior art differential writing entails a complete discharge of one bitline of the regarded bitline pair. This is depicted in FIG. 1, where a bitline TRUE denoted as BLT, is drawn to logic "0" level at time t=t1, t3 or bitline COMPLEMENT denoted as BLC, is drawn to logic "0" level at time t=t5, t7, etc. By way of contrast, reading discharges the bitline only partly, see bitline COMPLEMENT BLC at t=t8. Directly after the data is written or read, the bitlines are usually precharged for the following cycle in a so-called restore process, as in FIG. 1 at time t=t2, t4, t6, t9, etc.

The prior art precharging techniques count for a significant amount of power dissipated in the memory array since an array comprises a large number of bitlines and each of them is relatively long. The power consumption for a read cycle is lower than for a write cycle because the bitlines are not totally discharged in the read cycle case. It should be noted, however, that complementary system hardware, such as power supply or test equipment must be designed for peak array power during the case of a write operation. Since the total chip power is typically composed of clock power (40%), array power (40%) and power for logic (20%), it is evident that a reduction in power dissipated by the memory array may lead to a significant reduction in total power.

U.S. Pat. No. 5,848,015 assigned to Sony Corporation discloses a specific technique for reducing the power consumed during sequential read access operations of the memory cells within a memory block. According to this prior art approach, power saving is limited because it is first restricted to read access operations and does not include write access operations, and second this technique basically delays the time at which precharging takes place, namely when the memory access to the last memory cell within a given row is complete. Accordingly, this method can only be applied in particular applications in which a sequential read of the memory cells within one and the same row of a given memory block occurs over several cycles. In the general case, however, in which the access is non-sequential, cycle-selective and directed to a complete segment of an array—as it is the case with the most state of the art memory cells—this prior art method can not be efficiently applied. Further, this prior art disclosure leaves out the possibility to save power during write operations.

SUMMARY OF THE INVENTION

It is an objective of the present invention to provide an improved method of accessing memory cells within a memory block to reduce power consumption. In a preferred embodiment of the invention a reduction in power dissipation is realized by determining whether an access operation following a current access operation will be a read or write access, and performing a precharge of the bitlines of the array only when a read operation follows the current access operation.

The power savings can be realized, for example, by activating a "precharge" signal in order to restrict precharging to be performed only in those cases, in which it is determined that precharging is required, namely when the next following access to a memory block will be a read access. When a write access follows, the precharge signal is deactivated and precharging is disabled. This technique exploits the operational requirement of the sense amplifier that bitlines must be precharged in advance of a read access but not for a write access.

According to an aspect of the invention, a conventional precharge control signal may be combined with an external control signal to determine if the next cycle is a read cycle. If the combination is, for example, a simple AND gate, then a new effective precharge signal is generated that permits precharging of bitlines, when those bitlines are used for a read access in a respective next cycle. Thus, when the new precharge signal generated according to the invention is exploited at the end of a current cycle n, for example, in a restore phase of this cycle n, a respective bitline will not be precharged when the new precharge control signal indicates that in the following cycle n+1, data will be written to the respective memory segment.

The advantage results that, when a bitline carries a logical 1 (BL "true" is charged, BL "complement" is discharged) at cycle n, and a logical 1 value shall be written at cycle n+1 to a cell that is connected to the same pair of bitlines, then the power of precharge can be saved.

The power dissipation and savings analysis is difficult to calculate precisely from a theoretical point of view, but may be quantified through simulation and testing of an exemplar design incorporating the features of the invention. The reduction in power dissipation is estimated to be in a range between approximately 5% and 10%, when a statistically balanced read/write distribution is assumed.

Beyond improved power dissipation in memory arrays, a secondary advantageous effect of the invention is that complementary hardware that has to meet peak power constraints, can be designed for a lower peak power level, as peak power is substantially determined by the power required during bitline precharge prior to the write cycle in the prior art. In addition, the invention can be advantageously applied to SRAM arrays because of the segmentation of the array into discrete memory blocks.

BRIEF DESCRIPTION OF THE DRAWINGS

The present invention is illustrated by way of example and is not limited by the shape of the figures of the drawings in which.

DETAILED DESCRIPTION OF THE PREFERRED EMBODIMENT

Figure 2:
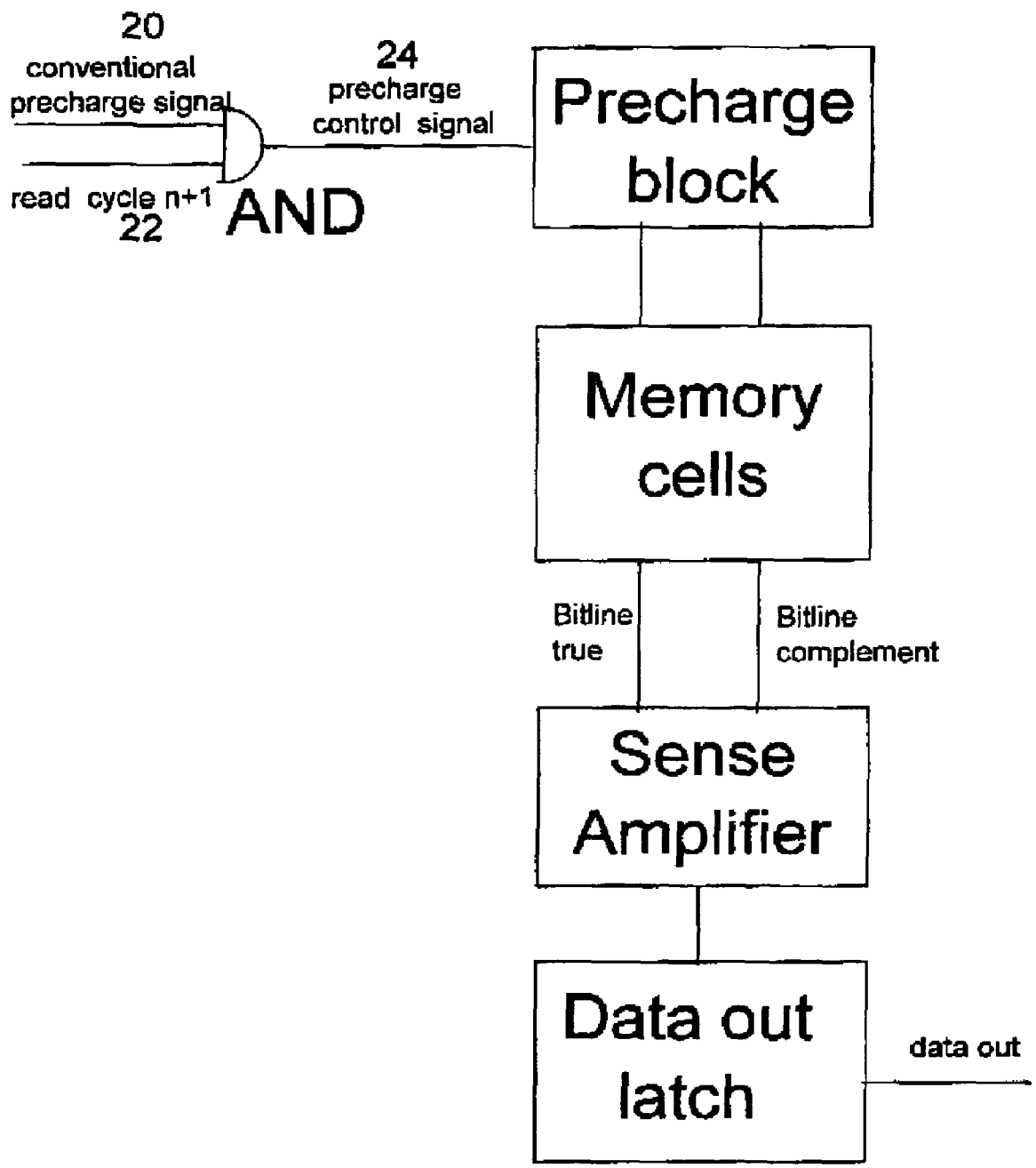
FIG. 2 is a schematic block diagram representation according to a first embodiment of the invention showing a portion of a memory array, wherein an existing external signal "read cycle n+1" is combined with a "conventional precharge signal" in an AND-gate thereby generating a new precharge signal for a respective array segment.

As shown in FIG. 2, the above-mentioned external signal 22 "read cycle n+1" is ANDed with the conventional precharge signal 20, thereby generating an effective precharge control signal 24, which may be used for controlling a respective memory segment. Of course, the combination of the two signals 20 and 22 to generate the effective precharge signal 24 is not restricted to an AND gate, but can also be realized by other logic implementations.

Figure 1:
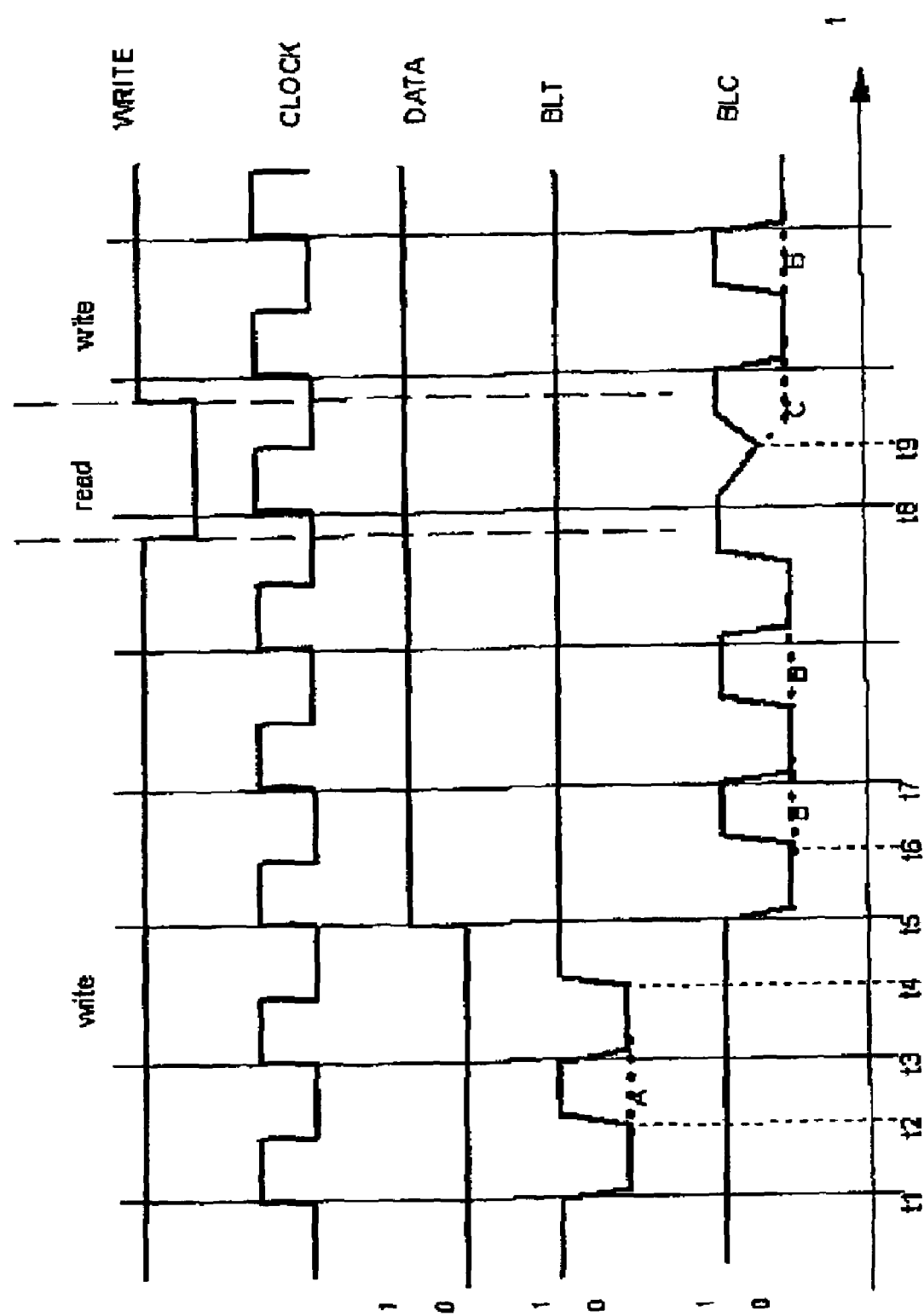
FIG. 1 is a voltage over time diagram illustrating the discharge and precharge of bitlines in prior art for a write and a read access, and illustrating in broken lines the avoidance of precharging according to the invention.

Referring again to FIG. 1, the broken lines in the bitline true (BLT) and bitline complement (BLC) timing signatures show the benefit achieved by the present invention. Namely, that the bitlines are not precharged when a write access follows a read or write access. For example, broken lines A and B in the BLT and BLC signals indicate that the bitlines are not precharged when a write access follows after a read access as further indicated by broken line C. However, benefits can only be achieved when the data, associated with that specific bitline does not change its value from cycle n to cycle n+1. Thus, no power savings between A and t5 are achievable.

Three examples of how to obtain the above-mentioned external signal "read cycle n+1" will be introduced below.

1. Read/Write Given by Array Function

In some cases the read/write information is provided inherently by the function of the memory array. For example, in a first aspect of the invention, all data is completely written to the array, and later, data is only read without further writing. Therefore, in cases in which the write access operations are performed over a longer period of time, depending on the application, the "read cycle n+1" signal may be set to "1" for the entire period of the write operation.

2. Read/Write Access is Known Two Clock Cycles in Advance

Figure 3:
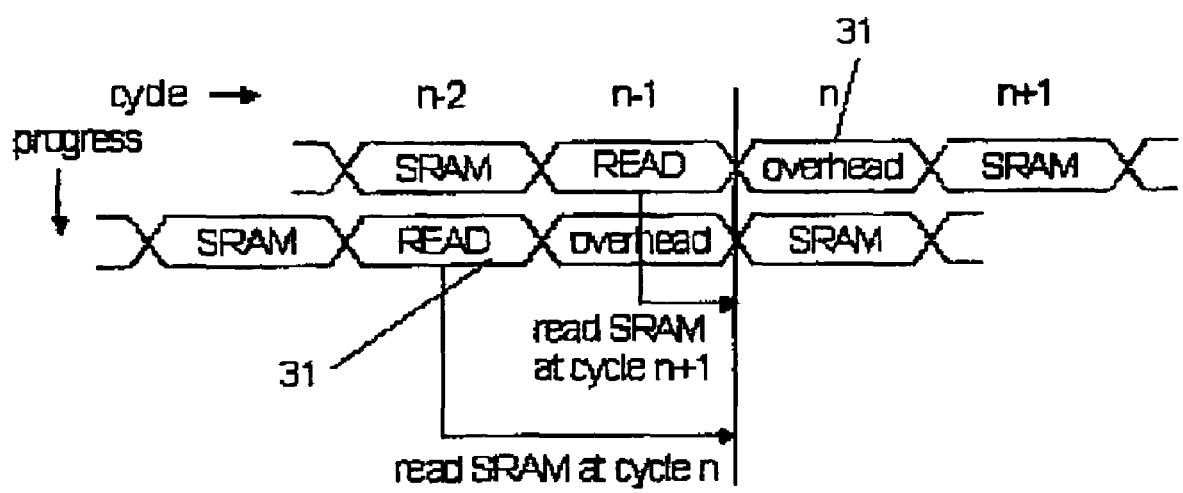
FIG. 3 is a schematic block diagram representation illustrating the use of the external control signal "read cycle n+1" in FIG. 2.

The situation where read/write is known two system timing cycles in advance according to a second aspect of the invention is depicted in FIG. 3, in which timing elapses from left to right and the memory access cycle progression is illustrated to develop from the top of the diagram down. The timing overhead 31 required to perform the access operation is shown. This latency period may be used to assert the external signal "read cycle n+1" noted above for generating the new precharge signal according to FIG. 2. In this case, the read/write signal is available basically two clock cycles in advance of the "read cycle n+1". When, for example, generating the array address takes two or more clock cycles, then the "read cycle n+1" signal is available at the start of the next access operation.

3. No Access Operation Required (No Op)

When none of the above methods is applicable, it is possible according to a third aspect of the invention to generate the required overhead latency specifically by adding an extra clock cycle to the memory array access time. The case in which "overhead" is replaced by "no op" is handled in a manner that is analogous to the situation depicted in FIG. 3. The nominal drawback of the delay of one clock cycle at each start of an access operation can be tolerated in many cases due to the considerable power savings that are realized and because data is typically returned each clock cycle during normal operation.

While the invention has been described in detail, the foregoing description is in all aspects illustrative and not restrictive. It is understood that numerous other modifications and variations can be devised without departing from the scope of the invention.

What is claimed is:

1. A method for accessing memory cells within a memory array operated with a precharge mechanism, in which differential read and write access operations are performed by activating a true bitline and a complement bitline, the method comprising:

combining a first precharge control signal with a read cycle (n+1) control signal to determine whether a next memory access operation occurring in a clock cycle subsequent to an access operation occurring in a current clock cycle is a read access operation or a write access operation wherein the read cycle (n+1) control signal is asserted according to an operating mode of the memory array, such that a write access operation occurring over a plurality of system clock cycles results in a continuous assertion of the next read cycle (n+1) control signal until the write access operation is complete; and performing a precharge of the true and complement bitlines only when a read access operation follows the access operation occurring in the current clock cycle.

2. A method for accessing memory cells within a memory array operated with a precharge mechanism, in which differential read and write access operations are performed by activating a true bitline and a complement bitline, the method comprising:

combining a first precharge control signal with a read cycle (n+1) control signal to determine whether a next memory access operation occurring in a clock cycle subsequent to an access operation occurring in a current clock cycle is a read access operation or a write access operation, wherein the read cycle (n+1) control signal is asserted two system clock cycles in advance of a next memory access operation during a delay between when an address of the memory array is specified and a current access operation is complete; and performing a precharge of the true and complement bitlines only when a read access operation follows the access operation occurring in the current clock cycle.

3. A method for accessing memory cells within a memory array operated with a precharge mechanism, in which differential read and write access operations are performed by activating a true bitline and a complement bitline, the method comprising:

combining a first precharge control signal with a read cycle (n+1) control signal to determine whether a next memory access operation occurring in a clock cycle subsequent to an access operation occurring in a current clock cycle is a read access operation or a write access operation, wherein the next read cycle (n+1) control signal is asserted after a delay of one clock cycle during a period of time when no memory operation is performed; and performing a precharge of the true and complement bitlines only when a read access operation follows the access operation occurring in the current clock cycle.

4. An integrated circuit memory array adapted for low power operation, comprising:

a plurality of addressable memory cells arranged in rows and columns, the memory cells segmented into a plurality of memory blocks;

a plurality of column lines, each coupled to a corresponding column of memory cells;

a plurality of row lines, each coupled to a corresponding row of memory cells;

a precharge circuit coupled to the plurality of row lines, the precharge circuit provided to assert the plurality of row lines in a memory block to a high logic level following a memory access operation;

a first precharge signal controller coupled to the precharge circuit, the first precharge signal controller provided to generate a first precharge control signal;

a read cycle signal controller for generating a read cycle (n+1) signal when a next memory access operation is a read access operation; and a logical AND gate adapted to evaluate the first precharge control signal and the read cycle control (n+1) signal, the logical AND gate asserting a second precharge control signal when a next memory access is a read access operation for controlling the precharge circuit.

5. The memory array according to claim 4, wherein the memory array is a static random access memory (SRAM).

* * * * *